US012782420B2

(12) United States Patent
Hall et al.

(10) Patent No.: US 12,782,420 B2
(45) Date of Patent: Nov. 3, 2026

(54) INTERCONNECT PROCESS MONITOR FOR ASSESSING WIRE PARASITICS ACROSS CONFIGURATIONS

(71) Applicant: International Business Machines Corporation, Armonk, NY (US)

(72) Inventors: Allen Hall, Cedar Park, TX (US); Daniel Lewis, Bangalore (IN); Jackson Gerber, Rochester, MN (US); Rahul M. Rao, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 519 days.

(21) Appl. No.: 18/419,932

(22) Filed: Jan. 23, 2024

(65) Prior Publication Data

US 2025/0237691 A1 Jul. 24, 2025

(51) Int. Cl.
*G01R 31/28* (2006.01)

(52) U.S. Cl.
CPC ................................ *G01R 31/2834* (2013.01)

(58) Field of Classification Search
CPC ..... G11C 29/006; G11C 29/02; G11C 29/025; G11C 2029/5002; G01R 31/2648; G01R 31/2831; G01R 31/2884; G01R 31/2834; G01R 27/2605
See application file for complete search history.

(56) References Cited

U.S. PATENT DOCUMENTS

| | | | | |
|---|---|---|---|---|
| 4,771,251 | A | 9/1988 | Allen et al. | |
| 5,757,820 | A * | 5/1998 | Angelotti | G01R 31/31855 714/738 |
| 7,489,204 | B2 | 2/2009 | Habitz et al. | |
| 7,594,149 | B2 | 9/2009 | Pilling | |

(Continued)

FOREIGN PATENT DOCUMENTS

| | | | |
|---|---|---|---|
| EP | 0802484 | A1 | 10/1997 |
| WO | 2000062339 | A1 | 10/2000 |

OTHER PUBLICATIONS

Chun-Chen Liu et al., “An Accurate Interconnect Test Structure for Parasitic Validation in On-Chip Machine Learning Accelerators,” arxiv.org, Dated Mar. 10, 2017, pp. 1-27.

*Primary Examiner* — Nha T Nguyen
(74) *Attorney, Agent, or Firm* — Kristofer Haggerty, Esq.; Kevin P. Radigan, Esq.; Heslin Rothenberg Farley & Mesiti P.C.

(57) ABSTRACT

Disclosed embodiments provide methods, systems, and computer program products for process monitoring of interconnect wiring configurations and determining interconnect wiring characteristics including resistor-capacitator (RC) delay and capacitance parasitics of a given interconnect wiring configuration of a chip design. A disclosed interconnect monitor structure includes multiple stages, where each stage includes a source latch to receive scan test pattern input, a buffered wire segment including defined interconnect wire and threshold voltage configurations, and a capture (Continued)

latch capturing output test scan patterns. Disclosed test pattern generation implementations enable efficient and effective wiring interconnect process monitoring and identifying interconnect wiring characteristics and performance for an interconnect wiring configuration of a given IC design.

20 Claims, 8 Drawing Sheets

(56) References Cited

U.S. PATENT DOCUMENTS

| | | | | |
|---|---|---|---|---|
| 7,721,236 | B2 | 5/2010 | Hwang et al. | |
| 8,225,248 | B2 | 7/2012 | Chen et al. | |
| 8,468,482 | B1 | 6/2013 | Pack et al. | |
| 10,846,454 | B2 | 11/2020 | Qian | |
| 2004/0193983 | A1 | 9/2004 | Whetsel, Jr. | |
| 2006/0109020 | A1* | 5/2006 | Savithri | G11C 29/006 324/750.3 |
| 2006/0109021 | A1* | 5/2006 | Savithri | G01R 31/2831 324/750.3 |
| 2007/0298527 | A1* | 12/2007 | Mina | H10P 74/207 257/E21.531 |
| 2008/0143348 | A1* | 6/2008 | Pavithran | G01R 31/2853 324/683 |
| 2014/0101500 | A1 | 4/2014 | Bastimane et al. | |
| 2020/0177193 | A1 | 6/2020 | Schober et al. | |
| 2021/0102990 | A1* | 4/2021 | Lu | G01R 27/2605 |
| 2022/0120806 | A1* | 4/2022 | Qian | G01R 31/2601 |
| 2023/0019197 | A1* | 1/2023 | Dai | G01R 27/2605 |

* cited by examiner

250

| 252 Bit Range | 254 Width | 256 Space | 258 Layer | 260 VT |
|---|---|---|---|---|
| 0-5 | W10 | 10 | S1 | VT1 |
| 6-11 | W10 | 10 | S1 | VT2 |
| 12-17 | W10 | 10 | S2 | VT1 |
| 18-23 | W10 | 10 | S2 | VT2 |
| 24-29 | W10 | 15 | S1 | VT1 |
| 30-35 | W10 | 15 | S1 | VT2 |
| 36-41 | W10 | 15 | S2 | VT1 |
| 42-47 | W10 | 15 | S2 | VT2 |
| 48-53 | W10 | 20 | S2 | VT1 |
| 54-59 | W10 | 20 | S1 | VT2 |
| 60-65 | W10 | 20 | S2 | VT1 |
| 66-71 | W10 | 20 | S2 | VT2 |
| 72-77 | W15 | 15 | S1 | VT1 |
| 78-83 | W15 | 15 | S1 | VT2 |
| 84-89 | W15 | 15 | S2 | VT1 |
| 90-95 | W15 | 15 | S2 | VT2 |
| 96-101 | W20 | 15 | S1 | VT1 |
| 102-107 | W20 | 15 | S1 | VT2 |
| 108-113 | W20 | 15 | S2 | VT1 |
| 114-119 | W20 | 15 | S2 | VT2 |
| 120-125 | W20 | 20 | S1 | VT1 |
| 126-131 | W20 | 20 | S1 | VT2 |
| 132-137 | W20 | 20 | S2 | VT1 |
| 138-143 | W20 | 20 | S2 | VT2 |

FIG. 2B

400

Base Pattern 412 [ 0101 0101 0101 ]
Bypass bits 414 [ 000000 ]
Deadbits 416 [ 0000 0000 0000]

Pattern 420
5p_HH_BPnull_DBnull

| | | Stage 424 | | | | | |
|---|---|---|---|---|---|---|---|
| | | 0 | 1 | 2 | 3 | 4 | 5 |
| | 0 | 000000 | 100000 | 010000 | 101000 | 010100 | 001010 |
| | 1 | 100000 | 010000 | 101000 | 010100 | 101010 | 010101 |
| | 2 | 000000 | 100000 | 010000 | 101000 | 010100 | 001010 |
| | 3 | 100000 | 010000 | 101000 | 010100 | 101010 | 010101 |
| | 4 | 000000 | 100000 | 010000 | 101000 | 010100 | 001010 |
| Bank | 5 | 100000 | 010000 | 101000 | 010100 | 101010 | 010101 |
| Bit | 6 | 000000 | 100000 | 010000 | 101000 | 010100 | 001010 |
| 422 | 7 | 100000 | 010000 | 101000 | 010100 | 101010 | 010101 |
| | 8 | 000000 | 100000 | 010000 | 101000 | 010100 | 001010 |
| | 9 | 100000 | 010000 | 101000 | 010100 | 101010 | 010101 |
| | 10 | 000000 | 100000 | 010000 | 101000 | 010100 | 001010 |
| | 11 | 100000 | 010000 | 101000 | 010100 | 101010 | 010101 |

FIG. 4A

450

Base Pattern 462 [ 0101 0101 0101 ]
Bypass bits 464 [ 000000 ]
Deadbits 466 [ 1010 0110 1001]

Pattern 470
5p_HH_BPnull_DB0xa69

Stage 474

| | | 0 | 1 | 2 | 3 | 4 | 5 |
|---|---|---|---|---|---|---|---|
| | 0 | 100000 | 110000 | 111000 | 111100 | 111110 | 111111 |
| | 1 | **1**00000 | 010000 | 101000 | 010100 | 101010 | 01010**1** |
| | 2 | 100000 | 110000 | 111000 | 111100 | 111110 | 111111 |
| | 3 | **1**00000 | 010000 | 101000 | 010100 | 101010 | 01010**1** |
| | 4 | **0**00000 | 100000 | 010000 | 101000 | 010100 | 00101**0** |
| Bank | 5 | 100000 | 110000 | 111000 | 111100 | 111110 | 111111 |
| Bit | 6 | 100000 | 110000 | 111000 | 111100 | 111110 | 111111 |
| 472 | 7 | **1**00000 | 010000 | 101000 | 010100 | 101010 | 01010**1** |
| | 8 | 100000 | 110000 | 111000 | 111100 | 111110 | 111111 |
| | 9 | **1**00000 | 010000 | 101000 | 010100 | 101010 | 01010**1** |
| | 10 | **0**00000 | 100000 | 010000 | 101000 | 010100 | 00101**0** |
| | 11 | 100000 | 110000 | 111000 | 111100 | 111110 | 111111 |

FIG. 4B

INTERCONNECT PROCESS MONITOR FOR ASSESSING WIRE PARASITICS ACROSS CONFIGURATIONS

BACKGROUND

The present invention relates to integrated circuit design, and more specifically, to methods and structures for implementing interconnect process monitoring of interconnect wiring configurations of a chip design and identifying wire resistor-capacitator (RC) delay and capacitance parasitic characteristics for the interconnect wiring configurations of the chip design.

In integrated circuit (IC) or semiconductor chip designs, a significant challenge remains to provide effective interconnect wiring configurations in a given chip design. Current semiconductor chip designs continue to require smaller wiring sizes in wiring metallization layers and wiring layouts. Smaller wires increase wire resistance and denser wiring pitches cause higher coupling capacitance, which limit performance of the IC. New techniques and interconnect process monitor structures are needed that can enable effective and early identification of interconnect wiring issues and performance validation of interconnect wiring configurations in chip designs.

SUMMARY

Disclosed embodiments provide methods, systems and computer program products for process monitoring of interconnect wiring configurations of semiconductor chip designs.

A disclosed computer implemented method comprises providing an interconnect process monitor structure comprising a plurality of latch stages coupled together, where each latch stage comprises a source latch, a buffered wire segment, a capture latch. The method comprises configuring the interconnect monitor structure to define wire and threshold voltage configurations for each respective buffered wire segment of the plurality of latch stages to represent a hardware interconnect wiring configuration for a chip design; scanning one or more test scan patterns into the interconnect monitor structure and capturing output test scan patterns from the interconnect monitor structure to determine wire Resistor-Capacitor (RC) parasitics of one or more buffered wire segments; and determining, based on the wire RC parasitics of the one or more buffered wire segments, performance behavior of the hardware interconnect wiring configuration for the chip design.

Other disclosed embodiments include a computer system and computer program product for implementing interconnect process monitoring of interconnect wiring configurations of a chip design, implementing features of the above-disclosed method.

BRIEF DESCRIPTION OF THE DRAWINGS

FIG. 2B illustrates example multiple engineered wire configurations of respective buffered wire segments of the interconnect monitor structure of FIG. 2A of one or more disclosed embodiments;

FIGS. 4A and 4B respectively illustrate example scan pattern configuration implementations used for process monitoring of interconnect wiring characteristics including wire RC parasitics of one or more disclosed embodiments;

DETAILED DESCRIPTION

Figure 1:
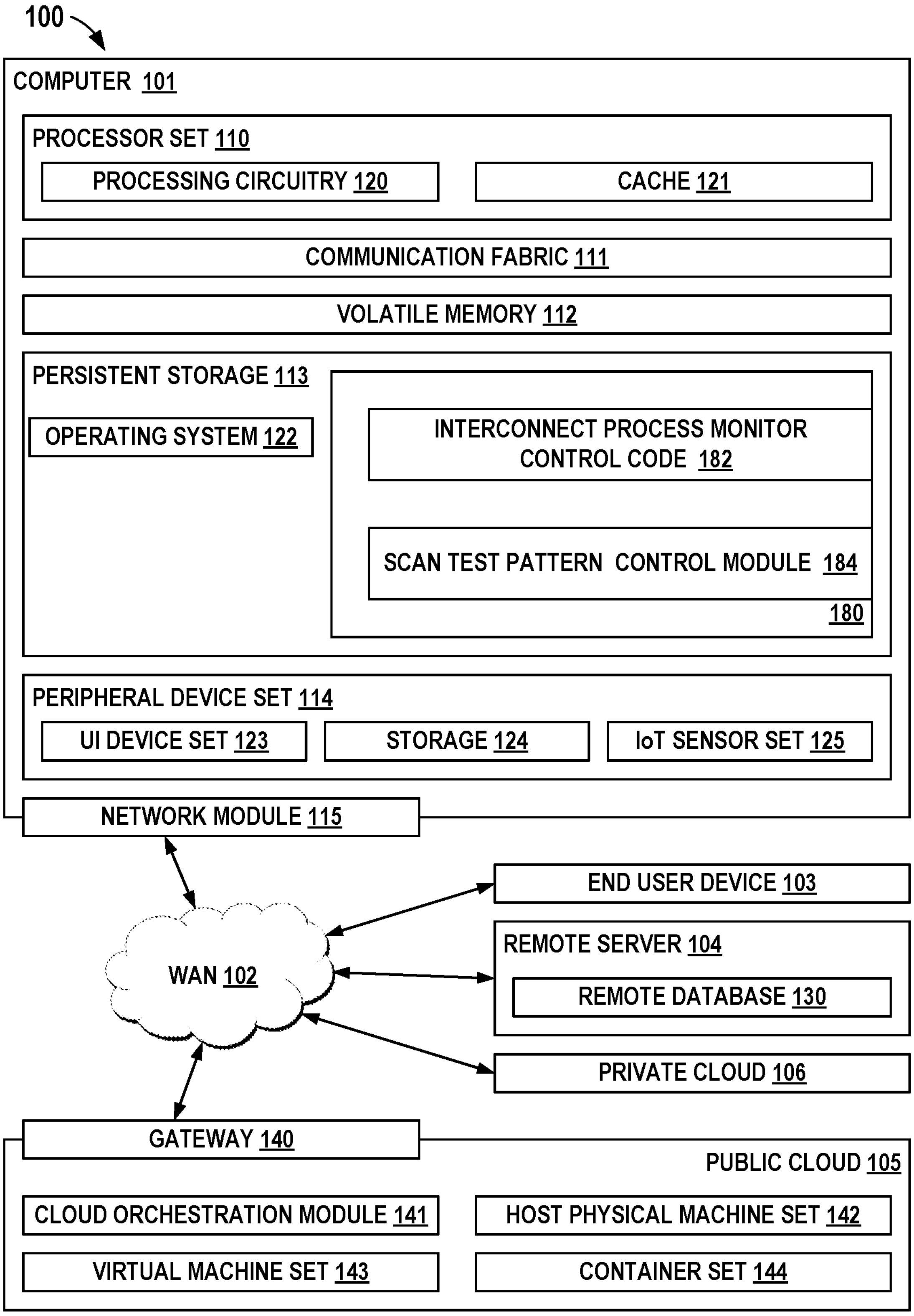
FIG. 1 is a block diagram of an example computer environment for use in conjunction with one or more disclosed embodiments.

The embodiments herein describe an interconnect monitor structure and techniques for interconnect wiring process monitoring and identifying interconnect wiring characteristics including AC wire resistor-capacitor (RC) characteristics and AC capacitance parasitics of a hardware interconnect wiring configuration of a chip design. A disclosed interconnect monitor structure includes multiple stages coupled together, each stage includes a source latch receiving test pattern data, a capture latch outputting test pattern data and a buffered wire segment coupled between the source latch and capture latch, which includes engineered wire configurations replicating the hardware interconnect wiring configuration of the chip design. The embodiments herein describe test pattern generation methods enabling efficient and effective wiring interconnect monitoring and identification of interconnect performance issues and validation of the hardware interconnect wiring configuration of a given IC design. The generated test patterns of disclosed embodiments applied to the interconnect monitor structure include a determined number of cycles of functional clocks to scan out test pattern data from one or more capture latches of one or more selected stages of the interconnect monitor structure that enables determining wire RC delay and capacitance parasitics of the selected stages. The disclosed embodiments enable early identification of metallization problems in interconnect wiring configurations, correlation of interconnect wiring RC characteristics to HW interconnect wiring configurations, for example, for enabling re-targeting interconnect wiring on higher metallization layers, and AC validation of wire RC paths.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Referring to FIG. 1, a computing environment 100 contains an example of an environment for the execution of at least some of the computer code involved in performing the inventive methods, such as an Interconnect Process Monitor Control Code 182 and a Scan Test Pattern Control Module 184, at block 180. In addition to block 180, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 180, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 180 in persistent storage 113.

COMMUNICATION FABRIC 111 is the signal conduction path that allows the various components of computer

101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 180 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2A:
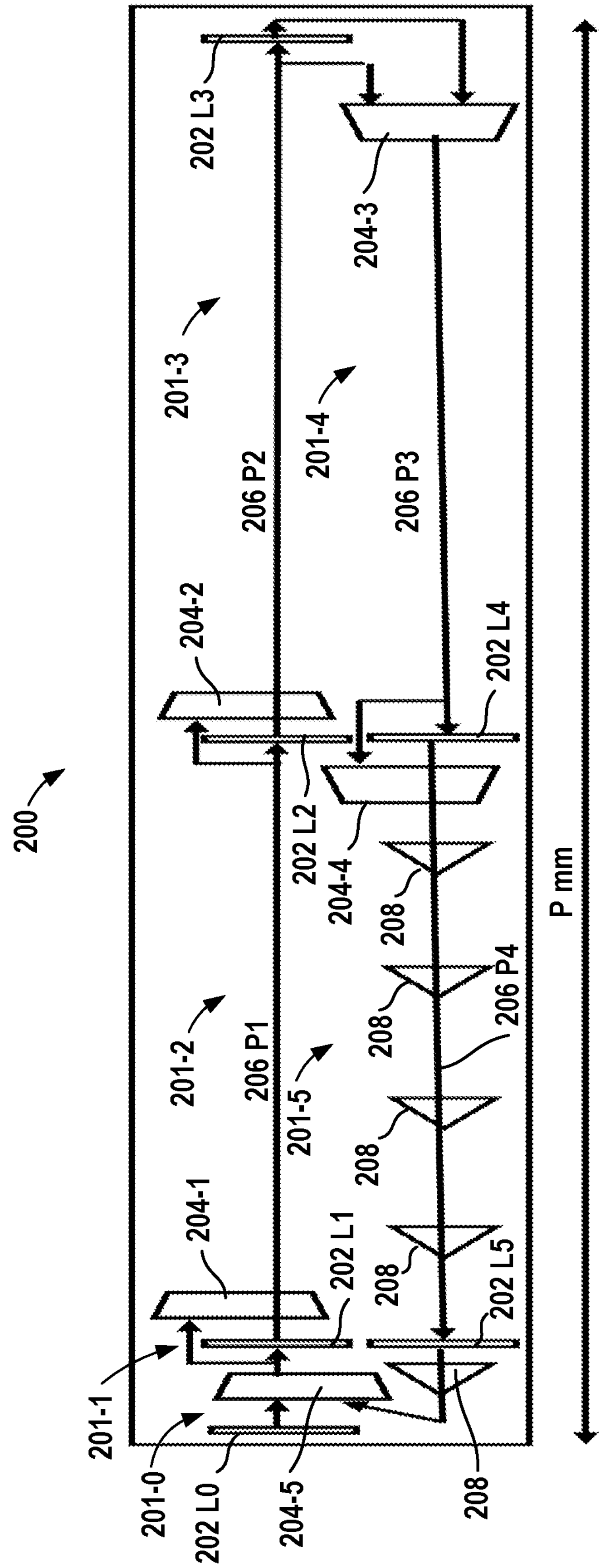
FIG. 2A schematically illustrates an example interconnect monitor structure for process monitoring of interconnect wiring characteristics including wire Resistor-Capacitor (RC) characteristics and capacitance parasitics between wires of one or more disclosed embodiments.

FIG. 2A schematically illustrates a disclosed embodiment of an interconnect monitor structure 200 for process monitoring of interconnect wiring characteristics including RC parasitics of a hardware (HW) interconnect wiring configuration of a given IC design. The interconnect monitor structure 200 is used in conjunction with the computer 101 in FIG. 1 with the Interconnect Process Monitor Control Code 182 and Scan Test Pattern Control Module 184 for process monitoring of interconnect wiring characteristics of disclosed embodiments.

The interconnect monitor structure 200 implements an interconnect wiring model that replicates a physical metal hardware (HW) interconnect wiring configuration of semiconductor chip designs. As shown, the interconnect monitor structure 200 is formed by a plurality of latch stages 201 0-5 coupled together with minimal combinatorial logic in between, while various numbers of latch stages can be implemented with the interconnect monitor structure. The latch stages 201 0-5 includes a plurality of latches 202 L0-L5, where each of the latches 202 is arranged to implement scannable stages to receive scan test pattern data, enabling flexibility for scan in and scan out test patterns of disclosed embodiments. Each of the latch stages 201 0-5 includes a respective multiplexer structure 204 1-5 to enable selectively bypassing one or more specific latch stages of selected latch chain positions. A respective long buffered wire segment 206 P1, 206 P2, 206 P3, 206 P4 coupled between latches L1 and L2, L2 and L3, L3 and L4, L4 and L5, via a respective one of the multiplexer structures 204 1-4 enables efficient process monitoring of multiple variants of HW interconnect wiring configurations of semiconductor chip designs.

As shown, each of the respective scannable latches 202 L1-L5 of the latch stages 201 1-5 is coupled to respective buffered wire segments 206 for receiving input scan test patterns and providing output scan test patterns. The scannable latch 202 L0 is an input setup latch that receives input scan test patterns coupled via multiplexer structure 204-5 to the latch stages 201 1-5. Each multiplexer structure 204 1-5 of the respective stages 201 1-5 allows bypassing selected latches, i.e., based on pattern bypass settings (e.g., implemented with the Scan Test Pattern Control Module 184) to convert bypassed stage latches L0-L5 to transparent operation, i.e., allowing the scan test pattern output to follow the scan test pattern input. Each of the respective buffered wire segments 206 P1, P2, P3, and P4 represents a selected (i.e., variable) length within the replicated HW interconnect wiring configuration. Each of the respective buffered wire segments 206 P1, P2, P3, and P4 includes engineered wire configurations and stage placements to replicate one or multiple different HW interconnect wiring configurations for a specific chip design. The illustrated buffered wire segment 206 P4 includes a plurality of spaced apart inverters or drivers 208 that are provided to accurately replicate a specific segment of a given HW interconnect wiring configuration. For example, interconnect monitor structure 200 enables multiple variants of wire configurations and multiple different scan test patterns being applied on multiple wiring levels located in close proximity within the buffered wire segments 206 P1, P2, P3, P4. In an embodiment, different groups of bits are tagged as different wire configurations, (e.g., multiple wire code configurations 250 as illustrated in FIG. 2B) each with a defined threshold voltage VT of drivers/invertors/buffers within the latch stage 201 for the respective buffered wire segments 206 P1, P2, P3, P4. The respective buffered wire segments 206 P1, P2, P3, P4 are configured with specific engineered wire configurations replicating the HW interconnect wiring configuration for a given chip design enabling effective and efficient monitoring with generated scan test patterns of disclosed embodiments. For example, different wire configurations are represented by Cm as follows:

$$Cm=B*N \text{ bits}$$

Where N=different wire codes (e.g., 24 wire codes), and B=bits per wire code (e.g., 6 bits per wire codes)

In an embodiment, the wire codes for different wire configurations define interconnect wire and voltage parameters directly related to HW interconnect performance across a broad population of chip and wafer designs, including defined combinations of wire parameters, wire usage, and signal hostility for large-scale high-performance chip designs. The defined interconnect wire parameters include actual hardware interconnect wire size or width, spacing between wires, a wire layer, and an associated threshold voltage value, for multiple interconnect signal paths which directly affect interconnect RC parasitics to be determined. In the illustrated interconnect monitor structure 200, the long wire segments 206 P1 and 206 P2 of latch stages 201-2 and 201-3 can be effectively modeled by respective engineered wire configurations extending in a first direction from left to right, and the wire segments 206 P3 and 206 P4 of latch stages 201-4 and 201-5 are modeled extending in an opposite direction from right to left. Scan test patterns are generated based on intelligent pattern generation algorithms of Interconnect Process Monitor Control Code 182 and applied with the Scan Test Pattern Control Module 184 of disclosed embodiments, for example, including multiple different hostility scan test patterns directly affecting interconnect RC parasitics to be determined. The Interconnect Process Monitor Control Code 182 of the disclosed interconnect monitor structure 200 enables effective determination of RC parasitics between wires carrying signals that travel in both the same and opposite directions over long distances, closely modelling the actual combinations of wire usage and hostility that appear on a large-scale high-performance chip. The Scan Test Pattern Control Module 184 of the disclosed interconnect monitor structure 200 applies generated scan test patterns to one or more latch stages 201 across multiple wires of the interconnect monitor structure 200 to automatically determine interconnect RC parasitics of the one or more selected wire segments 206. In a disclosed embodiment, the generated scan test patterns can drive specific hostility signals on neighboring wires, and enable isolating hostility effects on the HW interconnect wiring configurations of various chip designs.

The interconnect monitor structure 200 enables efficient process monitoring to identify issues in multiple different layers of the replicated interconnect wiring configurations of the various chip designs. The interconnect monitor structure 200 enables isolating any of the stage latch stages 201-0, 201-1, 201-2, 201-3, 201-4. 201-5. The interconnect monitor structure 200 is selectively arranged in different chains of latch stages 201 0-5, (e.g., implemented by Scan Test Pattern Control Module 184) to enable different stage distances (i.e., enabling a different device to wire parasitic ratio). The interconnect monitor structure 200 enables efficiently replicating different interconnect wiring configurations with scan in patterns directly applied to selected scan latches L0-L5, enabling efficient identification of metallization problems of multiple different interconnect layers, and validating wire RC paths across an entire chip path and across selected wire segments, such as selected wire segments, 206 P1, P2, P3, P4 (e.g., implemented by the Interconnect Process Monitor Control Code 182 and Scan Test Pattern Control Module 184).

Multiple operational modes of the interconnect monitor structure 200 are enabled based on the selected configuration of latch stages 201 0-5, implemented by the Scan Test Pattern Control Module 184. For example, the impact of across chip variation (ACV) is minimized by running a bypass mode of the interconnect monitor structure 200, where intermediate latch stages, such as selected latch stages 201-2, 201-3, 201-4 and 201-5 are bypassed through the respective multiplexer structures 204. For example, a ring operational modes of the interconnect monitor structure 200 is implemented by feeding back an output of last latch stage 201-5 to the first stage 201-1 through the multiplexer structure 204-5. The ring operational mode of the interconnect monitor structure 200 enables efficient testing, providing effective test coverage to validate HW interconnect performance across a broad population of chip and wafer designs.

FIG. 2B provides example illustrative wire configurations 250 of one or more disclosed embodiments. Each wire configuration 250 includes a defined bit range 252 (e.g., 6-bit ranges for different wire codes), a width 254 (e.g., W10, W15, or W20 wire size), a space 256 (e.g., 10, 15, or 20 neighbor wire space), a layer 258 (e.g., S1, S2 wiring layer), and a threshold voltage VT 260 (e.g., VT1, VT2). For example, the multiple wire configurations 250 provide respective engineered wire configurations of respective buffered wire segments 206 P1, P2, P3, P4. The width 254, space 256, layer 258, and threshold voltage VT 260 are significant wire parameters or contributors impacting wire RC parasitics determined by the interconnect monitor structure 200 of disclosed embodiments.

Figure 3:
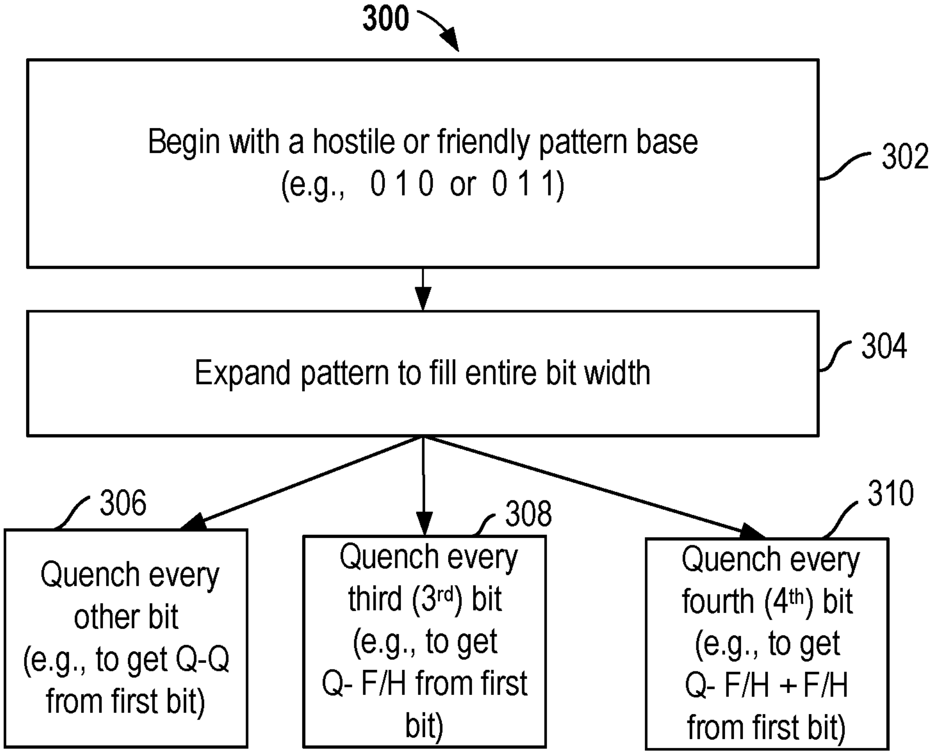
FIG. 3 is a flow chart illustrating of example operations of an example pattern generation method of one or more disclosed embodiments.

FIG. 3 illustrates of an example pattern generation method 300 for generating test scan patterns applied to the interconnect monitor structure 200 of one or more disclosed embodiments. The pattern generation method 300 can be implemented by the computer 101 of FIG. 1 with the Interconnect Process Monitor Control Code 182 and the Scan Test Pattern Control Module 184 for generating test scan patterns for effective use with the interconnect monitor structure 200 of disclosed embodiments to determine wire RC parasitics of HW interconnect wiring configurations of the various chip designs.

Operations begin at block 302 with a hostile or friendly base pattern, for example 011 or 010, where 010 represents a hostile base pattern, and 011 represents a friendly base pattern. In an embodiment, the friendly base pattern includes some repeating bit values, while the hostile base pattern includes alternating switching bit values. At block 304, the selected friendly or hostile pattern is expanded to fill an entire bit width. For example, an expanded hostile base pattern includes all switching bit values, such as 0101 0101 0101, for a 12-bit width.

In a given N bits per wire configuration, multiple different pattern hostility configurations are disclosed, such as, a scan test pattern of all bits switching provides a Hostile Hostile (HH) configuration, represented by:

Pattern 1: <0101 0101 0101>⇔<1010 1010 1010> Hostile-Hostile

Different variants of Hostile Quiet and Quiet Quiet configurations, (e.g., implemented by the computer 101 with the Interconnect Process Monitor Control Code 182 and the Scan Test Pattern Control Module 184), are provided by combining bits switching and rest or dead bits (i.e., held at logic 0 or 1), such as represented by:

Pattern 2: <0101 0001 0100>⇔<1000 1010 0010> Quiet-Hostile

Pattern 3: <0101 0101 0101>⇔<0000 0000 0000> Quiet-Quiet

Pattern 4: <0100 0001 0101>⇔<1010 1010 0010> Hostile-Hostile+Quiet-/Quiet

For example, in the illustrated Patterns above, bit 1 (i.e., second bit from the left) is experiencing the listed hostility as it switches, except in Pattern 4, in which bit 1 sees Hostile-Hostile, while bit 4 sees Quiet-Quiet.

In a disclosed embodiment, providing different numbers of clock pulses with different pattern hostility, (e.g., implemented by the computer 101 with the Interconnect Process Monitor Control Code 182 and the Scan Test Pattern Control Module 184), enables isolation of any of the various latch stages 201 0-5 of the interconnect monitor structure 200. In a disclosed embodiment, further providing different numbers of clock pulses along with bypass mode operation of the interconnect monitor structure 200 enables ACV testing.

Returning to FIG. 3, at block 306, every other bit is quenched or omitted for generating test scan patterns of a Quiet-Quiet bit pattern from the first bit. At block 308, every third bit is quenched for generating test scan patterns of a Quiet-Friendly/Hostile bit pattern from the first bit. At block 310, every fourth bit is quenched for generating test scan patterns of a Quiet-Friendly/Hostile And Friendly/Hostile bit pattern from the first bit.

Referring to FIGS. 4A and 4B, example scan pattern generation implementations 400 and 450 are shown including pattern hostility configurations, for example used with the interconnect monitor structure 200 for process monitoring of interconnect wiring RC parasitics of one or more disclosed embodiments. In FIG. 4A, the illustrated scan pattern generation 400 includes a Base Pattern 412 [0101 0101 0101], Bypass bits 414 [000000], and Deadbits 416 [0000 0000 0000], to provide hostile-hostile (HH) scan pattern 420 represented by 5p_HH_BPnull. The HH scan pattern 420 includes vertically illustrated Bank Bits 422 0-11 and horizontally illustrated stages 424 0-5. The HH scan pattern 420 includes 6-bit values shown in the specific stages 424 0-5 and bit latch per clock cycle, where the leftmost bit is the scan initialization value; and the rightmost value is the expected scan output after 5 pulses. As shown, the scan initialization value and the expected scan output are identical with the BPnull because there are no stages bypassed, the DBnull with no deadbits dropped, and 5 pulses are required to move from stage 0 to stage 5.

In FIG. 4B, the illustrated scan pattern generation 450 includes a Base Pattern 462 [0101 0101 0101], Bypass bits 464 [000000], and Deadbits 466 [1010 0110 1001] for HH scan pattern 420 represented by 5p_HH_BPnull_DB0xa69. As shown, the HH scan pattern 470 includes vertically illustrated Bank Bits 472 0-11 and horizontally illustrated stages 474 0-5. The HH scan pattern 470 includes 6-bit values shown in the specific stages 424 0-5 and bit latch per clock cycle, where the leftmost bit is the scan initialization value; and the rightmost value is the expected scan output after 5 pulses. As shown, the scan initialization value and the expected scan output are identical values, with included bit values shown as bold values for the Bank Bits 472, 1, 3, 4, 7, 9 and 10 with the BPnull. The DBOxa69 of scan pattern 470 is due to hex value of deadbits dropped (e.g., held to 1 as shown with 1010 0110 1001), and 5 pulses are required to move from stage 0 to stage 5, where no stages are bypassed of scan pattern 470.

Figure 5:
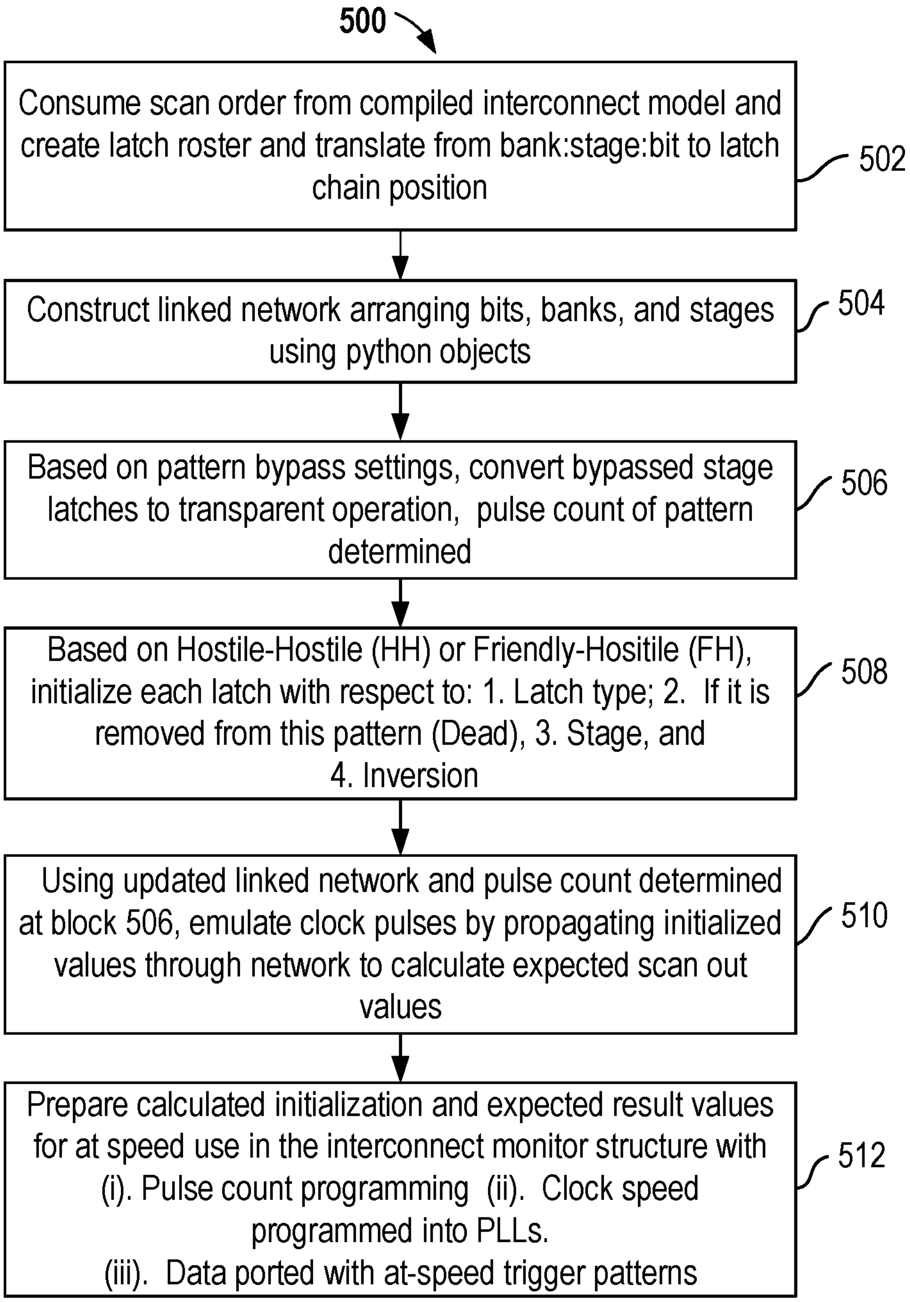
FIG. 5 is a flow chart illustrating of example operations of an example pattern generation method for process monitoring of interconnect wiring characteristics including RC parasitics of one or more disclosed embodiments.

FIG. 5 illustrates of example operations of an example pattern generation implementation method 500 for process monitoring of HW interconnect wiring configurations of the various chip designs to determine interconnect wiring characteristics including RC parasitics of one or more disclosed embodiments. The pattern generation implementation 500 can be implemented by the interconnect monitor structure 200, with computer 101, Interconnect Process Monitor Control Code 182 and Scan Test Pattern Control Module 184 for generating test scan patterns of disclosed embodiments.

At block 502, a scan order from a compiled model of a HW interconnect wiring configuration of a given chip design is consumed and a latch roster or list is created and translated from bank:stage:bit to latch chain or stage position of the interconnect monitor structure 200. At block 504, a linked network is constructed arranging bits, banks, and stages, for example, using python objects. At block 506, based on pattern bypass settings, (e.g., implemented by Scan Test Pattern Control Module 184) selected bypassed stage latches 202 L1-L5 are converted to transparent operation, and a pulse count of the pattern is determined to scan the pattern data through the linked network. At block 508, based on HH or FH base pattern, each latch is initialized with respect to 1.) Latch type, 2.) If it is removed from this pattern (Dead), 3.) Stage, and 4.) Inversion (where Inversion from scan-in pin taken into account). At block 510, using the updated linked network with the initialized latches and the pulse count determined at block 506, clock pulses are emulated by propagating scan initialized values through the linked network to calculate expected scan out values. At block 512, calculated initialization and expected result values for at speed testing use in the interconnect monitor structure 200 are prepared, including pulse count programming for the replicated HW interconnect wiring configurations implemented by the interconnect monitor structure 200, with clock speed programmed and scan out data obtained for at-speed trigger patterns.

Figure 6:
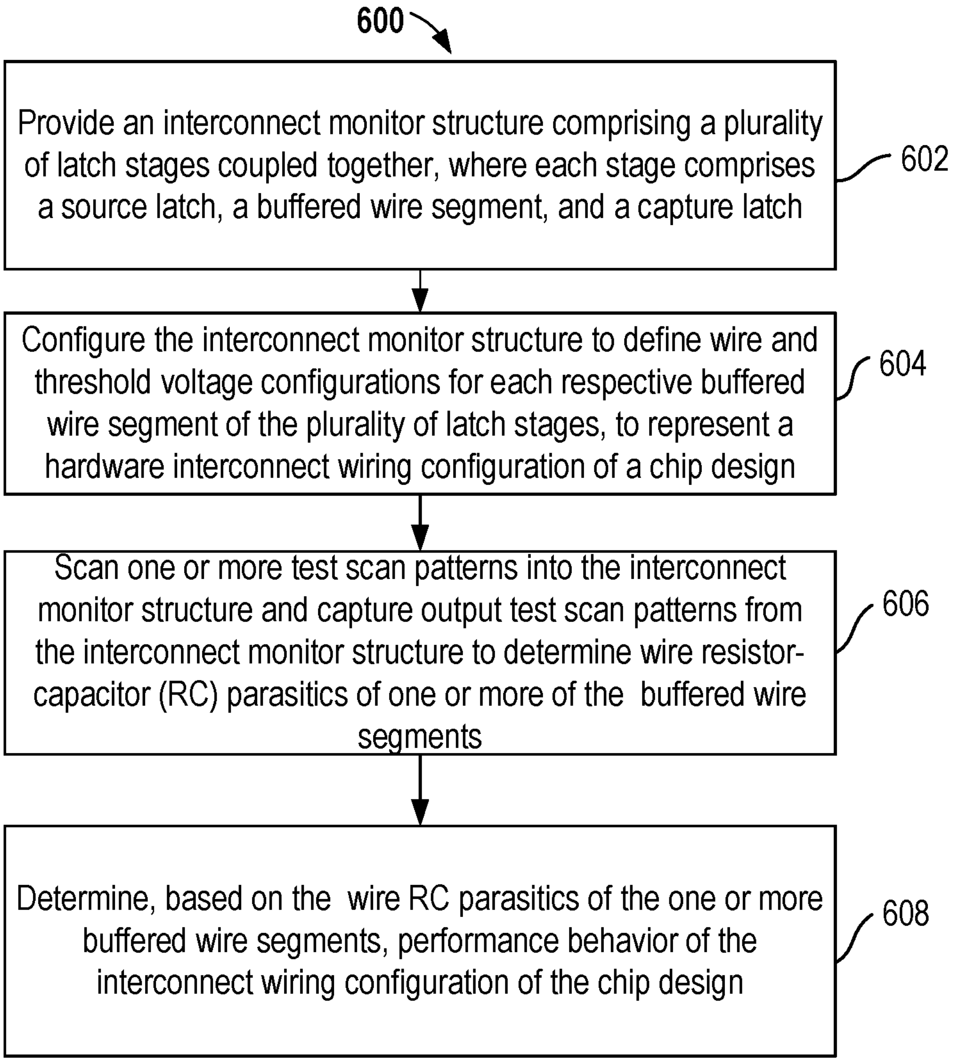
FIG. 6 is a flow chart illustrating a method for process monitoring of interconnect wiring characteristics of one disclosed embodiment.

FIG. 6 is a flow chart illustrating a method 600 for implementing process monitoring of interconnect wiring characteristics including RC parasitics of one or more disclosed embodiments. Method 600 can be implemented with interconnect monitor structure 200 in conjunction with the computer 101 in FIG. 1 and Interconnect Process Monitor Control Code 182 of disclosed embodiments.

At block 602, an interconnect monitor structure is provided, where the interconnect monitor structure comprises a plurality of latch stages, where each latch stage comprises a source latch, a buffered wire segment, and a capture latch. In a disclosed embodiment, scannable latches implement the plurality of latch stages and each latch stage includes a multiplexer structure, enabling multiple selected operational modes, such as a bypass operational mode of the interconnect monitor structure.

At block 604, the respective latch stages of the interconnect monitor structure are configured to define wire and threshold voltage configurations for each respective buffered wire segment of the plurality of latch stages to represent a hardware interconnect wiring configuration for a chip design. In a disclosed embodiment, engineered wire configurations for the respective buffered wire segments are defined by different wire configuration codes including groups of bits representing wire parameters or contributors impacting wire RC parasitics determined by the interconnect monitor structure 200. The wire configuration codes represent multiple wire parameters, such as wire width 254, space 256, layer 258, and threshold voltage VT 260 illustrated in FIG. 2B, of the hardware interconnect wiring configuration, which enable implementing multiple variants of wire configurations.

At block 606, one or more test scan patterns are scanned into the interconnect monitor structure 200 and output test scan patterns are captured from the interconnect monitor structure to determine wire Resistor-Capacitor (RC) parasitics of one or more buffered wire segments. The RC parasitics of one or more buffered wire segments reflect HW interconnect wiring characteristics of the hardware interconnect wiring configuration for the chip design. The test scan patterns represent different scan test hostility patterns directly affecting interconnect RC parasitics determined by the interconnect monitor structure. A number of functional clock cycles are determined for scanning in the test scan patterns into the interconnect monitor structure 200, to enable isolating selected latch stages. In an embodiment, one or more test scan patterns are scanned into the interconnect monitor structure with selected latch stages bypassed for monitoring ACV of the wire RC parasitics of the one or more buffered wire segments. At block 608, performance behavior of the hardware interconnect wiring configuration for the chip design is determined based on the RC parasitics of the one or more buffered wire segments.

While the foregoing is directed to embodiments of the present invention, other and further embodiments of the invention may be devised without departing from the basic scope thereof, and the scope thereof is determined by the claims that follow.

What is claimed is:

1. A computer implemented method comprising:

providing an interconnect monitor structure comprising a plurality of latch stages coupled together, wherein each stage comprises a source latch, a buffered wire segment, and a capture latch;

configuring the interconnect monitor structure to define wire and threshold voltage configurations for each respective buffered wire segment of the plurality of latch stages to represent a hardware interconnect wiring configuration for a chip design;

scanning one or more test scan patterns into the interconnect monitor structure and capturing output test scan patterns from the interconnect monitor structure to determine wire Resistor-Capacitor (RC) parasitics of one or more buffered wire segments; and determining, based on the wire RC parasitics of the one or more buffered wire segments, performance behavior of the hardware interconnect wiring configuration for the chip design.

2. The method of claim 1, wherein the interconnect monitor structure further comprises a multiplexer structure in each of the plurality of latch stages to enable predefined operational modes of the interconnect monitor structure.

3. The method of claim 2, further comprises performing a bypass operational mode of the interconnect monitor structure bypassing one or more selected latch stages in the interconnect monitor structure using the multiplexer structure.

4. The method of claim 1, wherein configuring the interconnect monitor structure further comprises configuring engineered wire configurations for the respective buffered wire segments, wherein the engineered wire configurations are defined by different wire configuration codes.

5. The method of claim 4, wherein configuring the engineered wire configurations further comprises defining predefined wire parameters that impact wire RC parasitics determined by the interconnect monitor structure.

6. The method of claim 5, wherein defining the predefined wire parameters further comprises defining one or more of a wire width, a wire space, a wire layer, and an associated threshold voltage for the buffered wire segments.

7. The method of claim 1, wherein scanning one or more test scan patterns into the interconnect monitor structure further comprises generating test scan patterns representing different scan test hostility patterns affecting interconnect RC parasitics determined by the interconnect monitor structure.

8. The method of claim 1, further comprises determining a number of functional clock cycles for scanning one or more test scan patterns test scan patterns into the interconnect monitor structure to enable isolating one or more selected latch stages.

9. The method of claim 1, wherein scanning one or more test scan patterns into the interconnect monitor structure further comprises bypassing selected latch stages, and scanning one or more test scan patterns test scan patterns into the interconnect monitor structure for monitoring across chip variation (ACV) of the wire RC parasitics of the one or more buffered wire segments.

10. The method of claim 1, wherein scanning one or more test scan patterns into the interconnect monitor structure further comprises generating test scan patterns for scanning into selected latch stages using a defined number of cycles of functional clocks, and capturing output test scan patterns with one or more selected latch stages.

11. A system, comprising one or more computer processors; and a memory containing a program which when executed by the one or more computer processors performs an operation, the operation comprising:

using an interconnect monitor structure comprising a plurality of latch stages coupled together, wherein each stage comprises a source latch, a buffered wire segment, and a capture latch;

configuring the interconnect monitor structure to define wire and threshold voltage configurations for each respective buffered wire segment of the plurality of latch stages, to represent a hardware interconnect wiring configuration for a chip design;

scanning one or more test scan patterns into the interconnect monitor structure and capturing output test scan patterns from the interconnect monitor structure to determine wire Resistor-Capacitor (RC) parasitics of one or more buffered wire segments; and determining, based on the wire RC parasitics of the one or more buffered wire segments, performance behavior of the hardware interconnect wiring configuration for the chip design.

12. The system of claim 11, wherein the interconnect monitor structure further comprises a multiplexer structure with each of the latch stages to enable predefined operational modes of the interconnect monitor structure.

13. The system of claim 12, further comprises performing a bypass operational mode of the interconnect monitor structure bypassing one or more selected latch stages in the interconnect monitor structure using the multiplexer structure.

14. The system of claim 11, wherein configuring the interconnect monitor structure further comprises configuring engineered wire configurations for the respective buffered wire segments, where the engineered wire configurations are defined by different wire configuration codes.

15. The system of claim 11, wherein scanning one or more test scan patterns into the interconnect monitor structure further comprises generating test scan patterns representing different scan test hostility patterns affecting interconnect RC parasitics determined by the interconnect monitor structure.

16. A computer program product comprising:

a computer readable storage medium having computer readable program code embodied therewith, the computer readable program code executable by one or more computer processors to perform an operation, the operation comprising:

using an interconnect monitor structure comprising a plurality of latch stages coupled together, wherein each stage comprises a source latch, a buffered wire segment, and a capture latch;

configuring the interconnect monitor structure to define wire and threshold voltage configurations for each respective buffered wire segment of the plurality of latch stages, to represent a hardware interconnect wiring configuration for a chip design;

scanning one or more test scan patterns into the interconnect monitor structure and capturing output test scan patterns from the interconnect monitor structure to determine wire Resistor-Capacitor (RC) parasitics of one or more buffered wire segments; and determining, based on the wire RC parasitics of the one or more buffered wire segments, performance behavior of the hardware interconnect wiring configuration for the chip design.

17. The computer program product of claim 16, wherein forming the interconnect monitor structure further comprises providing a multiplexer structure with each of the latch stages to enable predefined operational modes of the interconnect monitor structure.

18. The computer program product of claim 17, further comprises performing a bypass operational mode of the interconnect monitor structure bypassing one or more selected latch stages in the interconnect monitor structure using the multiplexer structure.

19. The computer program product of claim 16, wherein configuring the interconnect monitor structure further comprises configuring engineered wire configurations for the respective buffered wire segments, where the engineered wire configurations are defined by different wire configuration codes.

20. The computer program product of claim 16, wherein scanning one or more test scan patterns into the interconnect monitor structure further comprises generating test scan patterns representing different scan test hostility patterns affecting interconnect RC parasitics determined by the interconnect monitor structure.

* * * * *